United States Patent [19]

Manning

[11] Patent Number: 5,215,932
[45] Date of Patent: Jun. 1, 1993

[54] SELF-ALIGNED 3-DIMENSIONAL PMOS DEVICES WITHOUT SELECTIVE EPI

[75] Inventor: Monte Manning, Kuna, Id.

[73] Assignee: Micron Technology, Inc., Boise, Id.

[21] Appl. No.: 901,006

[22] Filed: Jun. 19, 1992

Related U.S. Application Data

[62] Division of Ser. No. 764,749, Sep. 24, 1991, abandoned.

[51] Int. Cl.[5] ............................................ H01L 21/336
[52] U.S. Cl. .......................................... 437/41; 437/52;
   437/56; 437/162; 437/915
[58] Field of Search ................. 437/52, 762, 915, 56,
   437/57, 58, 41; 748/DIG. 164

[56] References Cited

U.S. PATENT DOCUMENTS

| | | | |
|---|---|---|---|
| 4,467,518 | 8/1984 | Bansal et al. | 437/915 |
| 4,603,468 | 8/1986 | Lam | 437/915 |
| 4,651,408 | 3/1987 | MacElwee et al. | 437/915 |
| 5,083,190 | 1/1992 | Pfiester | 357/42 |
| 5,122,476 | 6/1992 | Fazan et al. | 437/52 |

OTHER PUBLICATIONS

Colinge, J. P., et al., "A High Density CMOS Inverter with Stacked Transistors", *IEEE Electron Device Letters*, vol. EDL-2, No. 10, Oct. 1981, pp. 250-251.

*Primary Examiner*—T. N. Quach
*Attorney, Agent, or Firm*—David J. Paul

[57] ABSTRACT

The present invention introduces a method to fabricate a self-aligning active PMOS device fabricated on top of an NMOS active device, thereby forming a CMOS inverter having a gate electrode being common to the two active devices. This fabrication technique provides for a less expensive method to form a CMOS inverter that may be used simply as an inverter or as a building block to construct an SRAM cell which results in reduced manufacturing cost compared to that of conventional CMOS fabrication processes. Standard transistors are formed in a starting substrate with a poly gate sandwich structure having its top layer serving as the channel region of the active PMOS of the present invention. Next, an inter-poly dielectric is deposited and a buried contact are formed to allow a subsequently deposited P+ poly of the PMOS device to make connection to the substrate diffusion areas. This P+ layer of poly is planarized to clear the poly over the NMOS poly gates and exposed the underlying oxide. The exposed oxide is removed and a thin blanketing layer of undoped poly is placed and patterned to form the active PMOS device of the present invention with subsequent anneals diffusing the underlying P+ dopant into the thin layer of poly and provides adequate source/drain overlap of the gate in the 3-dimensional PMOS device.

18 Claims, 3 Drawing Sheets

SELF-ALIGNED 3-DIMENSIONAL PMOS DEVICES WITHOUT SELECTIVE EPI

CROSS-REFERENCE TO RELATED APPLICATION

This is a divisional to U.S. Pat. Application No. 07/764,749 filed Sep. 24, 1991, now abandoned.

FIELD OF THE INVENTION

This invention relates to semiconductor devices and more particularly to a process to construct a 3-dimensional PMOS device structure that is self-aligned to an active NMOS device for use in integrated circuit devices, such as Static Random Access Memories (SRAMs).

BACKGROUND OF THE INVENTION

One of the common elements required in electrical circuit devices is the simple pullup (or pulldown device) from an active device to one of the power supply buses. The pullup is simple if used to construct a circuit using discrete components in that all that is required is selecting a resistor of the desired resistance and tolerance, connecting it between an active device, such as an open collector transistor, and $V_{cc}$ and the transistor's output would be pulled up to $V_{cc}$ once the transistor is forward biased. With the advent of the integrated circuit (IC) however, fabricating a resistance onto a wafer substrate, such as silicon or gallium arsenide, takes special consideration particularly when resistivity and tolerances play an important part in circuit operation.

For example, as SRAMs have evolved from the small 4Kb memory arrays to more densely packed array sizes, tolerances of pullup resistances (or pullup loads) had to be tightly controlled. In order to minimize standby current many fabrication processes adopted using an active device as the pullup. In CMOS fabrication it is common to see a PMOS transistor acting an active load device, by providing a current path between a memory cell access transistor and the power supply bus. In this manner the PMOS transistor could be gated on only when the desired line was to be pulled to $V_{cc}$ and turned off otherwise, thereby virtually eliminating leakage current and minimizing standby current for the SR device as a whole. In still other CMOS circuits, the active PMOS device in combination with the active NMOS device creates the common CMOS inverter which is used throughout integrated circuit.

Conventional methods to fabricate an active pullup device, such as is the method of fabricating a PMOS active device by the use of selective epitaxially grown silicon (EPI), are expensive. As integrated circuits become more dense (i.e., as the SRAM generations continue to grow) cost becomes an even more critical factor that must be taken into account in order to produce competitively priced parts.

The present invention introduces a method to fabricate a self-aligning active PMOS device fabricated on top of an NMOS active device, thereby forming a CMOS inverter having a gate electrode being common to the two active devices. This fabrication technique provides for a less expensive method to form a CMOS inverter that may be used simply as an inverter or as a building block to construct an SRAM cell which results in reduced manufacturing cost compared to that of conventional CMOS fabrication processes.

SUMMARY OF THE INVENTION

The invention is directed to a process to fabricate an active PMOS device self-aligned to an NMOS active device for use in an integrated circuit. The combination of the active PMOS device self-aligned to an active NMOS device may be used as an inverter in integrated circuits and more specifically as a building block to create memory static memory cells in integrated circuits such as in SRAM devices. The CMOS inverter of the present invention employs a low-cost method of manufacturing it, thus making it highly attractive for use in SRAM production.

Standard transistors are formed in a starting substrate with a poly gate sandwich structure having its top layer serving as the channel region of the active PMOS device of the present invention. Next, an inter-poly dielectric is deposited and a buried contact is formed to allow a subsequently deposited P+ poly, later to serve as source/drain terminals of the PMOS device, to make connection to the substrate diffusion area. This P+ layer of poly is planarized to clear the poly over the NMOS poly gate and exposed the underlying oxide. The exposed oxide is removed and a thin blanketing layer of undoped poly is placed and patterned to form the active PMOS device of the present invention. Subsequent annealing diffuses the underlying P+ dopant into the thin layer of poly and provides adequate source/drain overlap of the gate in the 3-dimensional PMOS device. At the same time, underlying N+ dopants (dopants residing in the poly layer directly overlying the poly gate) diffuse into the overlying thin poly thereby making this region to become the channel area of the PMOS device.

DETAILED DESCRIPTION OF THE PREFERRED EMBODIMENT

A first embodiment of the present invention is directed to a process for fabricating an active PMOS device using underlying doped polysilicon as the channel are to the PMOS device.

As a second embodiment and for sake of illustration, the process steps are integrated into a conventional SRAM fabrication process to form a CMOS inverter using the PMOS device of the present invention. Such a process to fabricate the CMOS inverter is easily incorporated into an existing SRAM process and utilized as a building block of an SRAM storage cell.

The process to develop the CMOS inverter using the active PMOS device of the present invention is described in a sequence shown in composite cross-sectional views of FIGS. 1–5 showing the main features of the CMOS inverter during fabrication.

Figure 1:
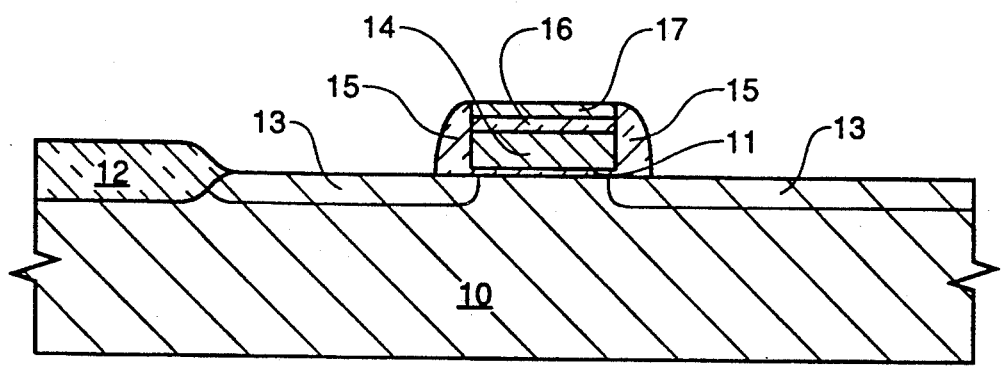
FIG. 1 is a composite cross-sectional view of an in-process wafer portion after formation of a standard MOS gate oxide followed by formation and patterning of a conformal layer of undoped polysilicon.

As shown in FIG. 1, a starting substrate 10, such as a silicon wafer is fabricated using conventional process steps, known to one skilled in the art, up to the point of having defined future locations of NMOS active devices with gate oxide 11 and forming of field oxide 12. Next, it is conventional to form gate poly 14, but in view of the present invention, prior to patterning gate poly 14, dielectric 16, of 300–500Å thick (oxide is preferred) and a thin undoped poly 17 (500 Å) are formed overlying gate poly 14. All three layers, poly 14, dielectric 16 and thin poly 17 are patterned together to form a active device gate structure common to both an NMOS and PMOS device yet to be completed. Dielectric spacers 15 are then created to isolate the sidewalls of the NMOS device. Starting substrate 10 is then doped to a n-type conductivity using conventional doping techniques to form diffusion regions 13 of an NMOS active device.

Figure 2:
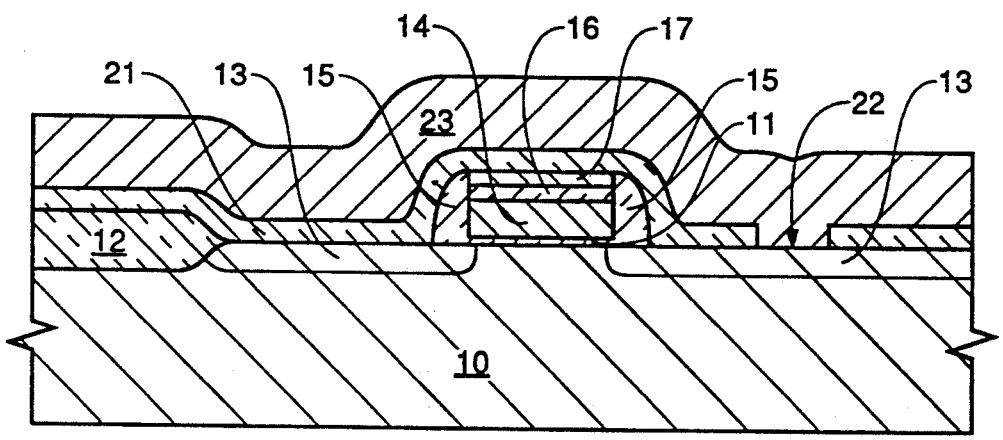
FIG. 2 shows a cross-sectional view of the in-process wafer portion of FIG. 1 after formation of oxide, defining a buried contact location followed by placement of P+ doped poly.

Referring now to FIG. 2, dielectric layer 21, being approximately 1500 Å thick, is formed (preferably oxide formed from TEOS source gas) and buried contact location 22 is patterned and etched to allow access to a diffusion region 13. Next a thick layer of polysilicon 23 is formed and doped to a p-type conductivity.

Figure 3:
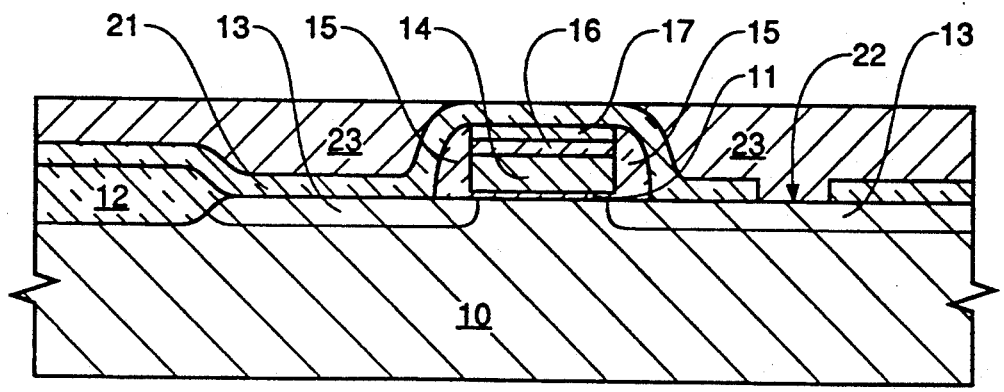
FIG. 3 show a cross-sectional view of the in-process wafer portion of FIG. 2, after planarization of the P+ poly.

Referring now to FIG. 3, poly 23 is planarized by using a chemical-mechanical method thereby exposing dielectric 21 overlying patterned poly 17.

Figure 4:
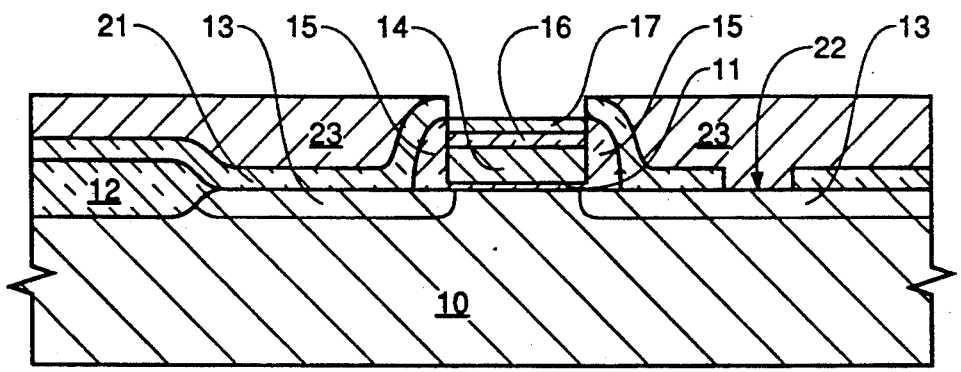
FIG. 4 shows a cross-sectional view of the in-process wafer portion of FIG. 3 after etching the exposed oxide (resulting from previous P+ poly planarization) over the gate region of an NMOS device.

Referring now to FIG. 4, exposed dielectric 21 is removed by an anisotropic etch with the etch stopping at patterned poly 17.

Figure 5:
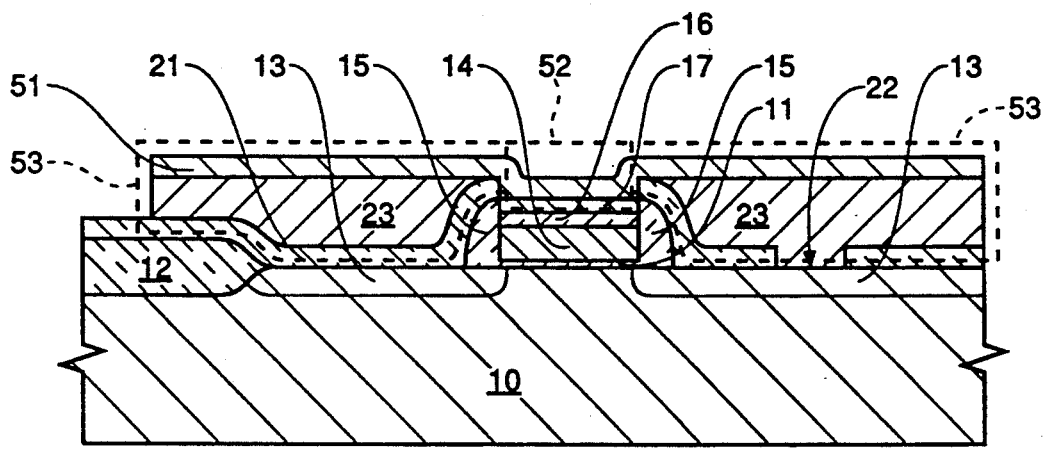
FIG. 5 shows a cross-sectional view of the in-process wafer portion of FIGS. 4, after placing and patterning of a layer of polysilicon followed by annealing steps.

Referring now to FIG. 5, a thin layer of conformal undoped poly 51 (approximately 500 Å in thickness) is deposited. Poly 51 provides contact from underlying p-type poly 23 to patterned poly 17. Poly 51 and poly 23 is then patterned and etched to define the width of the underlying 3-dimensional PMOS device. Afterwards, subsequent annealing drives the p-type dopants, present in poly 23, and the n-type dopants present in poly 17, into poly 51. Resulting from these annealing steps, n-type poly 17 causes the overlying poly 51 to take on an n-type conductivity at region 52, while p-type dopants present in poly 23 cause the overlying poly 51 to take on p-type conductivity at regions 53. Region 52 now serves as an n-type doped channel between p-type regions 53 that serve as source/drain for the PMOS active device. Gate poly 14 now becomes a common gate for both the NMOS and PMOS active devices. At buried contact location 22, a pn junction is formed between n-type diffusion 13 and p-type poly 23, thereby becoming a forward biased diode which couples the NMOS active device to the 3-dimensional PMOS device together to complete the inverter of the present invention. From this point on the starting substrate is completed using conventional process steps.

As one skilled in the art would readily recognize, many techniques are available to form dielectric or polysilicon layers. For example, it is well known that oxide may be grown or deposited by chemical vapor deposition (CVD), while polysilicon or other conductive materials may be sputtered on or likewise deposited by CVD. In the present invention, it is preferred to used CVD methods to deposit both dielectrics and conductive material unless otherwise specified in the preceding detailed description.

Figure 6:
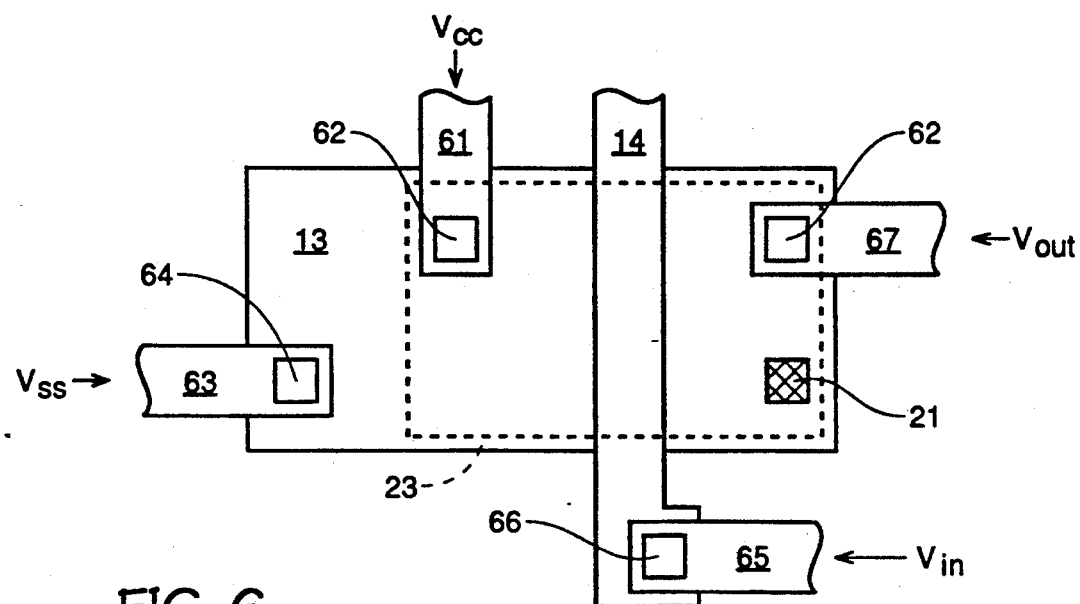
FIG. 6 shows a top view of a layout of the present invention in an inverter application.

FIG. 6 show a top view layout utilizing the present invention. N-type active area 13 is spanned by overlying common gate poly 14 with p-type, 3-dimensional poly 23 blanketing both. In this figure, the inverter of the present invention illustrates a coupling scheme beginning with conductor 61 coupled to poly 23 via contact 62. Typically 62 will be connected to the $V_{cc}$ supply of the integrated circuit. Next conductor 63 couples active area 13 to $V_{ss}$ via contact 64. Conductor 65 couples gate poly 14 to $V_{in}$ via contact 66 and finally, conductor 67 couples poly 23 (source/drain of 3-dimensional PS active device) to $V_{out}$. The pn junction is formed by buried contact 22 which couples poly 23 to diffusion area 13.

Figure 7:
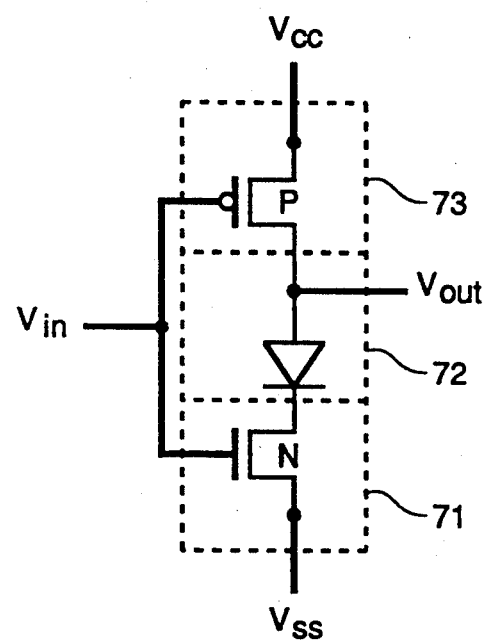
FIG. 7 is a schematic representation of inverter presented in the top view of FIG. 6.

FIG. 7 shows a schematic representation of the inverter illustrated in the top layout view of FIG. 6 which would be a typical result of the process steps described in FIGS. 1–5. Three-dimensional PMOS active device 73, has its source coupled to $V_{cc}$, its drain coupled $V_{out}$ and to the anode of pn diode 72, and its gate coupled to both the gate of NMOS active device 71 and $V_{in}$. The drain of NMOS device 71 is coupled to the cathode of diode 72 while its source is coupled to $V_{ss}$. The arrangement of FIG. 7 is easily recognizable as a CMOS inverter and could be adapted into an SRAM fabrication process as a building block to form one half of a static storage cell.

As one skilled in the art would realize, the conductivity types selected for doping the substrate and poly layers could be reversed to create an NMOS active device overlying and self-aligned to an active PMOS device if so desired.

The process steps depicted in FIGS. 1–5 serve as an example for the use of the 3-dimensional PMOS active device self-aligned to an NMOS active device in an SRAM cell. However, one skilled in the art may easily incorporate the process steps of FIGS. 1–5 into an applicable CMOS fabrication process where inverters may be used.

Therefore, it is to be understood that although the present invention has been described with reference to first and second embodiments, various modifications, known to those skilled in the art, may be made to the structure and process steps presented herein without departing from the invention as recited in the several claims appended hereto.

I claim:

1. A process for forming an active device, having second type conductivity overlying a first semiconductor layer having a first type conductivity, in a semiconductor integrated circuit fabricated on a starting substrate, said process comprising:
    a) forming a thin dielectric layer superjacent said first semiconductor layer;
    b) forming a second semiconductive layer having first type conductivity dopant impurities superjacent said thin dielectric layer;
    c) patterning and etching said first semiconductive layer, said thin dielectric layer, and said second semiconductive layer thereby exposing portions of said starting substrate, said patterned first semiconductive layer serving as a gate to said active device;

d) forming a thick dielectric layer superjacent said patterned layers and existing substrate surface;

e) forming a third semiconductive layer having second type conductivity dopant impurities superjacent said thick dielectric layer;

f) planarizing said third semiconductive layer thereby exposing a portion of said thick dielectric layer overlying said second patterned semiconductive layer;

g) anisotropically etching said exposed thick dielectric layer portion thereby exposing said second semiconductive layer;

h) forming a fourth semiconductive layer superjacent said planarized third semiconductive layer and said exposed second semiconductive layer; and i) annealing existing materials thereby causing said second type conductivity dopant impurities of said third semiconductive layer to diffuse into said fourth semiconductive layer thereby forming source and drain terminals, having said second type conductivity, of said active device, said annealing further causing said first type conductivity dopant impurities of said second semiconductive layer to diffuse into said fourth semiconductive layer thereby forming a channel region, having first type conductivity, for said active device.

2. The process of claim 1, wherein said starting substrate is a silicon wafer.

3. The process of claim 1, wherein said semiconductor integrated circuit is a static random access memory.

4. The process of claim 1, wherein said first semiconductive layer is single crystal silicon and said second, said third and said fourth semiconductive layers are polysilicon.

5. The process of claim 1, wherein said thin and thick dielectrics are oxides.

6. The process of claim 1, wherein said first type conductivity is n-type and said second type conductivity is p-type.

7. The process of claim 1, wherein said first type conductivity is p-type and said second type conductivity is n-type.

8. The process of claim 1, wherein said forming of said thin dielectric layer, said thick electric layer, and said first, second, third, and fourth semiconductive layers is by chemical vapor deposition.

9. A process for forming an inverter comprising a second active device having second type conductivity, overlying a first active device having a first type conductivity, in a semiconductor integrated circuit fabricated on a starting substrate, said process comprising:

a) forming a first thin dielectric layer overlying existing substrate surface;

b) forming a first semiconductive layer, having a first type conductivity, superjacent said first thin dielectric layer;

c) forming a second thin dielectric layer superjacent said first semiconductive layer;

d) forming a second semiconductive layer having first type conductivity dopant impurities superjacent said second thin dielectric layer;

e) patterning and etching said first semiconductive layer, said second thin dielectric layer, and said second semiconductive layer and said first thin dielectric layer thereby exposing portions of said first thin dielectric layer, said patterned first semiconductive layer serving as a common gate between said first and said second active devices;

f) forming dielectric spacers adjacent edges of said patterned layers;

g) implanting a dopant impurity through said first thin dielectric layer into said substrate surface thereby forming diffusion regions of first type conductivity on either side of the patterned layers resulting from step e, said diffusion regions and said first patterned semiconductive layer forming said first active device;

h) forming a thick dielectric layer superjacent said patterned layers, said dielectric spacers, and said diffusion regions;

i) opening a buried contact location in said thick dielectric layer thereby exposing an underlying diffusion region portion of said first active device;

j) forming a third semiconductive layer having second type conductivity dopant impurities, superjacent said thick dielectric layer, said third semiconductive layer coupling to said exposed diffusion region portion;

k) planarizing said third semiconductive layer thereby exposing a portion of said thick dielectric layer overlying said second patterned semiconductive layer;

l) anisotropically etching said exposed thick dielectric layer portion thereby exposing said second semiconductive layer;

m) forming a fourth semiconductive layer superjacent said planarized third semiconductor layer and said exposed second semiconductor layer; and n) annealing existing materials thereby causing said second type conductivity dopant impurities of said third semiconductor layer to diffuse into said fourth semiconductive layer thereby forming source and drain terminals, having said second type conductivity, of said second active device and said annealing causing said first type conductivity dopant impurities of said second semiconductive layer to diffuse into said fourth semiconductive layer thereby forming a channel region, having said first type conductivity, for said second active device.

10. The process of claim 9, wherein said starting substrate is a silicon wafer.

11. The process of claim 9, wherein said semiconductor integrated circuit is a static random access memory.

12. The process of claim 9, wherein said first semiconductive layer is single crystal silicon and said second, said third and said fourth semiconductive layers are polysilicon.

13. The process of claim 9, wherein said first and said second thin dielectrics and said thick dielectric are oxides.

14. The process of claim 9, wherein said first type conductivity is n-type and said second type conductivity is p-type.

15. The process of claim 9, wherein said first type conductivity is p-type and said second type conductivity is n-type.

16. The process of claim 9, wherein said forming of said first and second thin dielectric layers, said thick dielectric layer, and said first, second, third, and fourth semiconductive layers is by chemical vapor deposition.

17. The process of claim 9, wherein said forming of said first and second thin dielectric layers is by oxidation.

18. The process of claim 9, wherein said second active device is self-aligned to said first active device.

* * * * *